United States Patent
Shioda (10) Patent No.: US 8,150,070 B2
(45) Date of Patent: Apr. 3, 2012

(54) SOUND SIGNAL EQUALIZER FOR ADJUSTING GAIN AT DIFFERENT FREQUENCY BANDS

(75) Inventor: Tomoki Shioda, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 1169 days.

(21) Appl. No.: 11/984,598

(22) Filed: Nov. 20, 2007

(65) Prior Publication Data

US 2008/0118085 A1    May 22, 2008

(30) Foreign Application Priority Data

Nov. 21, 2006    (JP) .................................. 2006-314615

(51) Int. Cl.
*H03G 5/00* (2006.01)
(52) U.S. Cl. ............ 381/103; 381/98; 333/18; 333/28 R
(58) Field of Classification Search .................... 381/98, 381/103; 333/18, 28 R; 375/230
See application file for complete search history.

(56) References Cited

U.S. PATENT DOCUMENTS

| | | | | |
|---|---|---|---|---|
| 5,442,130 A | * | 8/1995 | Kitayama et al. | 84/661 |
| 5,594,383 A | * | 1/1997 | Tamba | 327/552 |
| 5,978,417 A | * | 11/1999 | Baker et al. | 375/232 |
| 6,046,628 A | * | 4/2000 | Sasaki | 329/300 |
| 6,580,327 B1 | * | 6/2003 | Joffe et al. | 330/304 |
| 8,064,508 B1 | * | 11/2011 | Lee | 375/229 |
| 2002/0196951 A1 | | 12/2002 | Tsai | |
| 2004/0161114 A1 | | 8/2004 | Koyanagi | |
| 2005/0074133 A1 | * | 4/2005 | Miyashita | 381/103 |
| 2005/0176396 A1 | * | 8/2005 | Miyagi | 455/313 |

FOREIGN PATENT DOCUMENTS

| | | |
|---|---|---|
| JP | A 05-090926 | 4/1993 |
| KR | A-10-2004-0029470 | 4/2004 |

* cited by examiner

*Primary Examiner* — Kimberly Nguyen
*Assistant Examiner* — Duy Nguyen
(74) *Attorney, Agent, or Firm* — Oliff & Berridge, PLC (57) ABSTRACT

A bass and treble audio tone control circuit configured as an integrated circuit, wherein a capacitor for setting a frequency band can be accommodated in an integrated circuit. A LPF extracts a low sound region component $S_{LO}$ from an initial sound signal $S_{IN}$. A low sound region adjustment circuit adjusts the gain of $S_{LO}$ and generates signal $S_{LT}$. An inverting circuit inverts $S_{LO}$ and an adding circuit extracts a high sound region component $S_{HO}$ by adding the inverted $S_{LO}$ and $S_{IN}$. A high sound region adjustment circuit adjusts the gain of $S_{HO}$ and generates a signal $S_{HT}$. A synthesizing circuit synthesizes $S_{IN}$ with $S_{HT}$ and $S_{LT}$, and generates an output sound signal $S_{OUT}$. The LPF is composed of an RC active filter, and the resistance that establishes the cutoff frequency is composed of an equivalent resistance using a switched capacitor circuit.

12 Claims, 7 Drawing Sheets

FIG. 1

(prior art)

SOUND SIGNAL EQUALIZER FOR ADJUSTING GAIN AT DIFFERENT FREQUENCY BANDS

CROSS-REFERENCE TO RELATED APPLICATION

The priority application number JP2006-314615 upon which this patent application is based is hereby incorporated by the reference.

BACKGROUND OF THE INVENTION

1. Field of the Invention

The present invention relates to a signal equalizer for adjusting the intensity of an initial signal in each of a plurality of frequency bands, and particularly relates to a sound signal equalizer such as a bass and treble audio tone control circuit or a graphic equalizer.

2. Description of the Related Art

In a sound apparatus, a graphic equalizer and bass and treble audio tone control circuit are used to perform boosting that increases the level of a prescribed frequency band or cutting that reduces the level of a prescribed frequency band.

Figure 1:
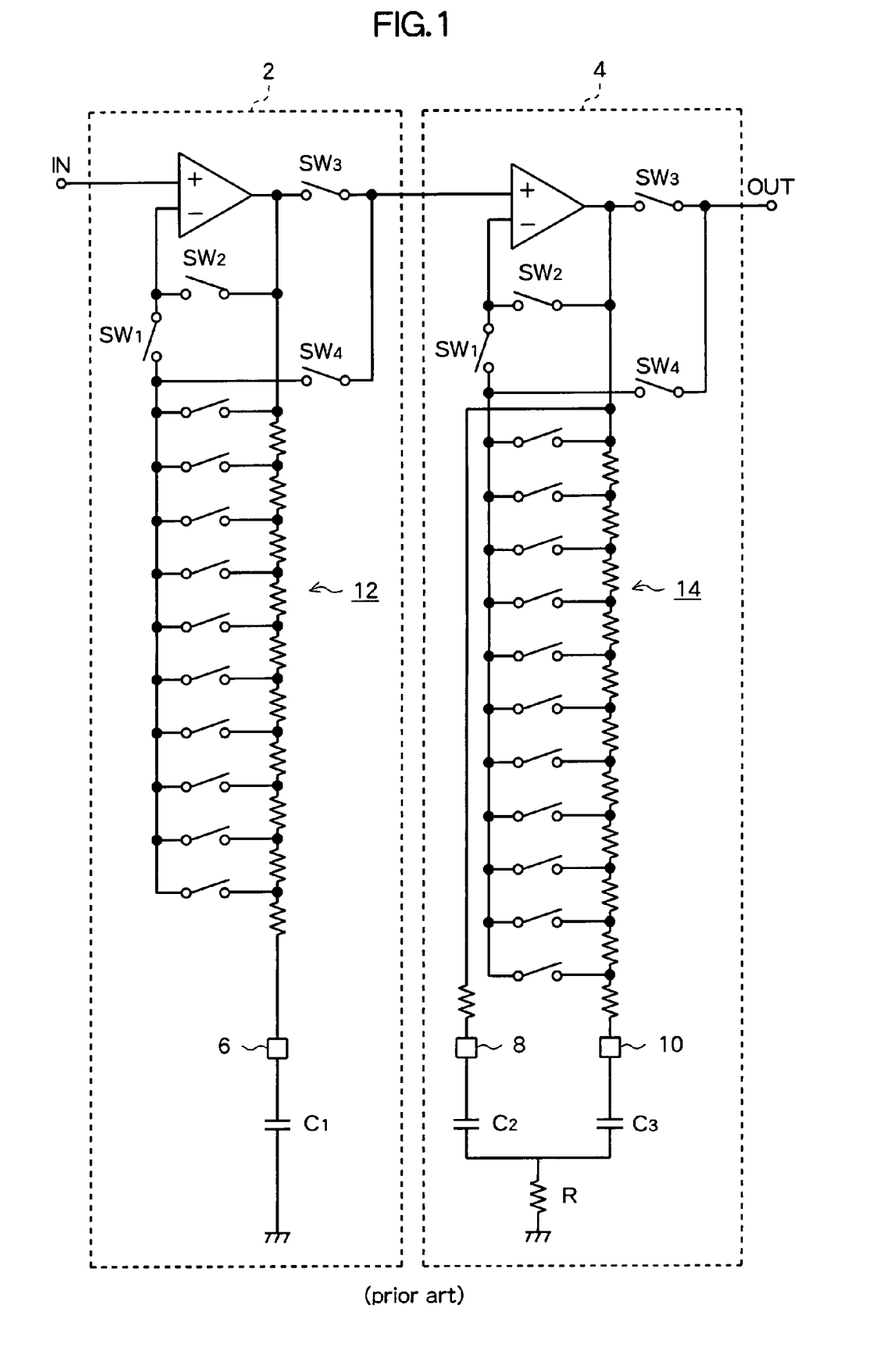
FIG. 1 is a circuit diagram showing the schematic configuration of a conventional bass and treble audio tone control circuit.

FIG. 1 is a circuit diagram showing the schematic configuration of a conventional bass and treble audio tone control circuit. The circuit has a treble band block 2 and a bass band block 4 that are connected in series between an input terminal IN and an output terminal OUT, and the sound signal inputted to the input terminal IN sequentially passes through the treble band block 2 and the bass band block 4 and is outputted from the output terminal OUT. The circuit is composed of principal parts integrally configured on a semiconductor substrate as an integrated circuit, and external parts that are connected to external terminals 6, 8, and 10 of the integrated circuit.

The treble band block 2 boosts or cuts the high-frequency component of the sound signal. A capacitor $C_1$ is connected to the external terminal 6 of the treble band block 2. Switches $SW_1$ and $SW_3$ are switched on when boosting is carried out. The treble band block 2 thereby constitutes a non-inverting amplifier having a differential effect and amplifies the high-frequency component of an inputted sound signal. Switches $SW_2$ and $SW_4$ are switched on when cutting is performed. The treble band block 2 thereby constitutes a low-pass filter (LPF) and attenuates the high-frequency component of an inputted sound signal.

On the other hand, the bass band block 4 boosts or cuts the low-frequency component of the sound signal. Capacitors $C_2$ and $C_3$ and a resistor $R_1$ are connected to the external terminals 8 and 10 of the bass band block 4. Switches $SW_1$ and $SW_3$ are switched on when boosting is carried out. The bass band block 4 thereby constitutes a non-inverting amplifier having an integrating effect and amplifies the low-frequency component of an inputted sound signal. Switches $SW_2$ and $SW_4$ are switched on when cutting is performed. The bass band block 4 thereby constitutes a high-pass filter (HPF) and attenuates the low-frequency component of an inputted sound signal.

The treble band block 2 and bass band block 4 are each provided with a number of resistors that are connected in series inside an integrated circuit. The series resistors 12 and 14 are divided into various ratios in accordance with which of the switches disposed in a plurality of locations is switched on, and the boosting or cutting gain can thereby be adjusted.

Also, the frequency band that is to be boosted or cut by the treble band block 2 and bass band block 4 is determined by the resistance value and capacitance value of the external components and the resistance value that is set in accordance with the manner in which the series resistors 12 and 14 are divided. In this case, the resistance value of the series resistor 12 and the capacitor $C_1$ must be set to relatively large values in order to set the frequency band that the treble band block 2 is to process in a high-frequency region of, e.g., about 10 kHz or higher, in a sound signal. In the same manner, the resistance value of the series resistor 14 and the capacitors $C_2$ and $C_3$ must be set to relatively large values when the frequency band that the bass band block 4 is to process is set in a low-frequency region of, e.g., about 100 kHz or lower, in a sound signal.

In an integrated circuit, the number of pins and other external terminals is limited, and the number of external components may need to be reduced due to the package size or other restrictions. A reduction in the number of external components would lead to expectations of fewer assembly steps, lower costs, and other advantages. From such a viewpoint, it is possible to consider housing the capacitors $C_1$ and $C_3$ inside the integrated circuit.

However, the capacitors $C_1$ to $C_3$ must be set to a relatively large value in the manner described above. There is therefore a problem in that a large surface area is required on the semiconductor substrate and the chip size is increased when the capacitors are accommodated in the integrated circuit. In this case, the capacitances of $C_1$ to $C_3$ can be reduced by increasing the resistance values of the series resistors 12 and 14 without changing the boosting or cutting frequency characteristics, but doing so results in a problem in that the surface area required by the series resistors 12 and 14 is increased. An equivalent resistance composed of switched capacitors can be used to implement a considerable resistance value in a relatively small surface area. However, there is a problem in that the large number of resistors connected in a series must be individually composed of switched capacitors in the series resistors 12 and 14 composed of resistors as described above, causing the circuit to be made more complicated and the size to increase. Due to these problems, $C_1$ to $C_3$ are not easily accommodated in an integrated circuit.

[Patent Document 1] Japanese Laid-open Patent Application No. H05-090926.

SUMMARY OF THE INVENTION

The present invention provides a signal equalizer and a sound signal equalizer that adjust the gain in each frequency band in an initial signal and a sound signal, wherein capacitors that establish the frequency bands are made smaller, the circuit is thereby reduced in size, and the number of external components and pins is reduced when the circuits are constituted as an integrated circuit.

The signal equalizer or the sound signal equalizer of the present invention adjusts the gain of a sound signal or another initial signal in each of the first to $n^{th}$ (where n is an integer of 2 or higher) frequency bands. The signal equalizer or the sound signal equalizer has first to $n^{th}$ extraction circuits that are provided in corresponding fashion to the first to $n^{th}$ frequency bands and that extract and output a corresponding frequency band component of the initial signal; first to $n^{th}$ gain adjustment circuits that are provided in corresponding fashion to the first to $n^{th}$ extraction circuits and that adjust the gain of an output signal of the corresponding extraction circuit and generate first to $n^{th}$ adjustment signals; and a synthesizing circuit that can synthesize the first to $n^{th}$ adjustment signals in the initial sound signal.

DESCRIPTION OF THE PREFERRED EMBODIMENTS

Modes of implementing the present invention (hereinafter referred to as "embodiments") are described below with reference to the diagrams.

Embodiment 1

Figure 2:
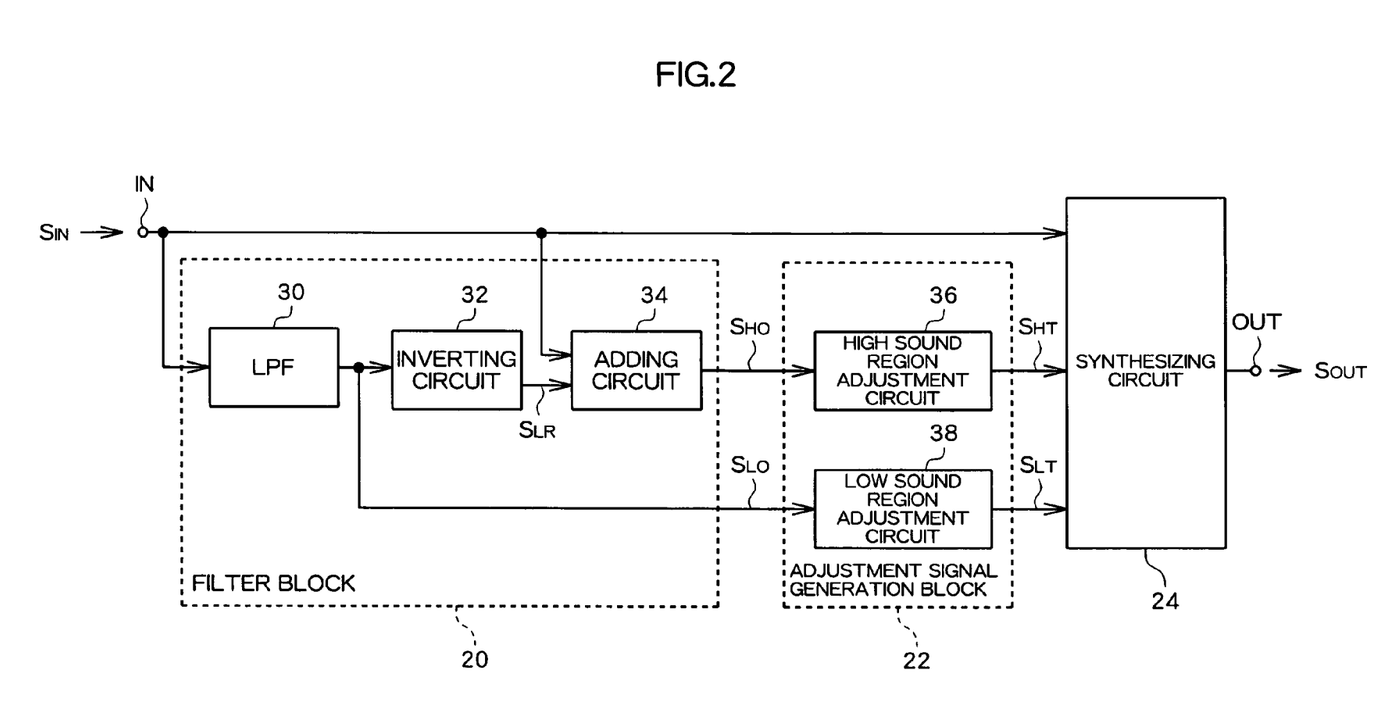
FIG. 2 is a schematic block diagram of a bass and treble audio tone control circuit of the first embodiment of the present invention.

FIG. 2 is a schematic block diagram of a bass and treble audio tone control circuit of the first embodiment of the present invention. The present circuit is integrally formed on a semiconductor substrate substantially as an integrated circuit (IC). The present circuit is composed of a filter block 20, an adjustment signal generation block 22, and a synthesizing circuit 24, wherein an initial sound signal $S_{IN}$ is inputted to an input terminal IN, and an output sound signal $S_{OUT}$ boosted or cut by adjusting the gain of the high sound region and the low sound region is outputted from an output terminal OUT. In the present circuit, the switching between boosting and cutting in the high sound region and the low sound region, and the boosting and cutting gain is set based on instruction signals from an external circuit.

The filter block 20 is provided with a high sound region extraction circuit that extracts the high sound region component $S_{HO}$ from $S_{IN}$ and outputs $S_{HO}$, and a low sound region extraction circuit that extracts the lower sound region component $S_{LO}$ from $S_{IN}$ and outputs $S_{LO}$. Specifically, the filter block 20 has an LPF 30, and this constitutes a low sound region extraction circuit.

The filter block 20 furthermore has an inverting circuit 32 and an adding circuit 34. The LPF 30, inverting circuit 32, and adding circuit 34 constitute a high sound region extraction circuit. The signal $S_{LO}$ extracted by the LPF 30 is inputted to the inverting circuit 32. The inverting circuit 32 generates an antiphase signal $S_{LR}$ from the inputted $S_{LO}$. The inverting circuit 32 is constituted using an inverting amplifier having an amplification ratio of 1, for example. The output $S_{LR}$ of the inverting circuit 32 is added by the adding circuit 34 to the initial sound signal $S_{IN}$. In this case, since $S_{LR}=-S_{LO}$, the low sound region component $S_{LO}$ contained in the initial sound signal $S_{IN}$ is canceled out in the adding circuit 34 by the output $S_{LR}$ of the inverting circuit 32. The adding circuit 34 outputs, as the high output area component $S_{HO}$, the component that remains after having removed $S_{LO}$ from $S_{IN}$.

The adjustment signal generation block 22 has a high sound region adjustment circuit 36 and a low sound region adjustment circuit 38. The high sound region adjustment circuit 36 and low sound region adjustment circuit 38 adjust the gain of the high sound region component $S_{HO}$ and the low sound region component $S_{LO}$, respectively, that are outputted from the filter block 20, and generate a high sound region adjustment signal $S_{HT}$ and a low sound region adjustment signal $S_{LT}$.

Figure 3:
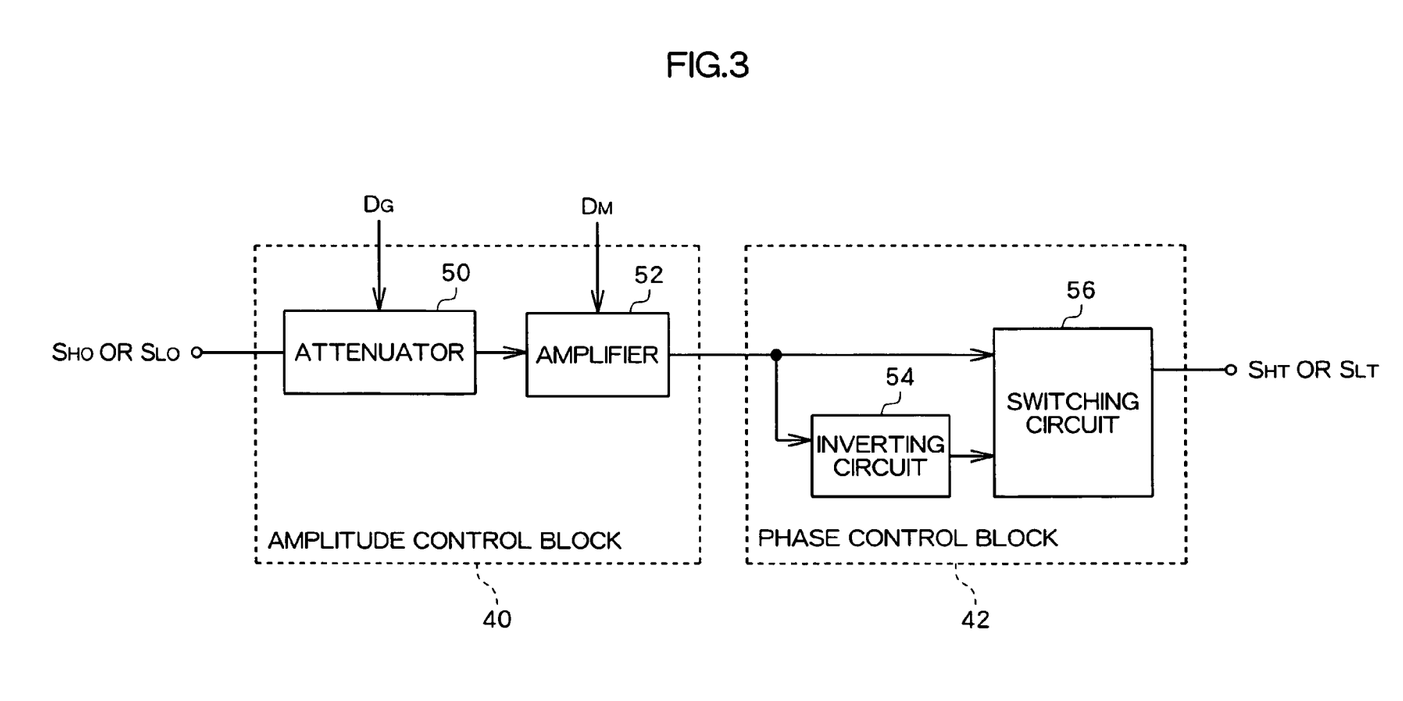
FIG. 3 is a schematic block diagram of an adjustment circuit for adjusting the gain of each band component.

FIG. 3 is a schematic block diagram of the high sound region adjustment circuit 36 and the low sound region adjustment circuit 38. The high sound region adjustment circuit 36 and low sound region adjustment circuit 38 have the same mutually common configuration. Here, the high sound region adjustment circuit 36 is described as an example with reference to FIG. 3.

The high sound region adjustment circuit 36 is composed of an amplitude control block 40 and a phase control block 42. The amplitude control block 40 controls the amplitude ratio $A(=|S_{HT}/S_{HO}|)$ of the generated high sound region adjustment signal $S_{HT}$ for the high sound region component $S_{HO}$ inputted to the high sound region adjustment circuit 36. The phase control block 42 controls whether the phase difference of $S_{HT}$ in relation to $S_{HO}$ is 0° or 180°, and determines whether to keep or invert the polarity of the $S_{HT}$ in relation to $S_{HO}$. The high sound region adjustment circuit 36 adjusts the gain composed of the amplitude ratio and polarity, and generates $S_{HT}$ in relation to $S_{HO}$ via the amplitude control block 40 and the phase control block 42.

The amplitude control block 40 is composed of an attenuator 50 and an amplifier 52. The amplifier 52 sets the gain $G_C$ in accordance with the adjustment width of the gain $G_{OUT}$ of $S_{OUT}$ in relation to $S_{IN}$, amplifies the input signal from the attenuator 50 by the gain $G_C$ to generate a signal $S_{HB}$, and outputs $S_{HB}$ to the phase control block 42. The gain $G_C$ that corresponds to the desired adjustment width of the gain $G_{OUT}$ may be a different value during boosting and cutting, as described below. In view of this situation, the amplifier 52 is configured so as to receive, as input from an external circuit, a mode signal $D_M$ that specifies boosting or cutting, and to be capable of switching the set value of $G_C$ in accordance with the signal $D_M$.

The attenuator 50 receives, as input from an external circuit, a gain control signal $D_G$ that specifies the gain adjustment amount, attenuates $S_{HO}$ in accordance with the signal $D_G$, and outputs the result to the amplifier 52. The amplitude control block 40 can adjust the amplitude ratio A in a range of $G_C$ to $-\infty$ dB when the attenuator 50 is configured so as to be capable of attenuation to $-\infty$ dB.

The phase control block 42 is composed of an inverting circuit 54 and a switching circuit 56. The inverting circuit 54 generates an inverse phase signal $S_{HC}$ by using $S_{HB}$ that is inputted from the amplitude control block 40. For example, the inverting circuit 54 is constituted by using an inverting amplifier that has an amplification ratio of 1. It should be noted that $S_{HC}=-S_{HB}$.

The switching circuit 56 is presented with $S_{HB}$ from the amplitude control block 40 and $S_{HC}$ from the inverting circuit 54, and one of the two signals is selectively outputted. The selection is made based on the mode signal $D_M$. $S_{HB}$ is outputted as $S_{HT}$ during a boost operation, and $S_{HC}$ is outputted as $S_{HT}$ during cutting.

The high sound region adjustment circuit 36 is described above, but the same process is carried out by the low sound region adjustment circuit 38 as well, and a low sound region adjustment signal $S_{LT}$ is generated from $S_{LO}$. Specifically, a signal $S_{LB}$ in which the polarity has been kept the same but the amplitude has been varied is generated from $S_{LO}$ during boosting and is then outputted as $S_{LT}$. On the other hand, a signal $S_{LC}$ in which the polarity of $S_{LB}$ has been inverted is generated during cutting and is then outputted as $S_{LT}$.

The high sound region adjustment signal $S_{HT}$ and low sound region adjustment signal $S_{LT}$ outputted by the high sound region adjustment circuit 36 and the low sound region adjustment circuit 38 are inputted to the synthesizing circuit 24, as shown in FIG. 2. The synthesizing circuit 24 also receives the initial sound signal $S_{IN}$ as input, adds and synthesizes the signals $S_{IN}$, $S_{HT}$, and $S_{LT}$, and outputs the result as $S_{OUT}$.

Figure 4A:
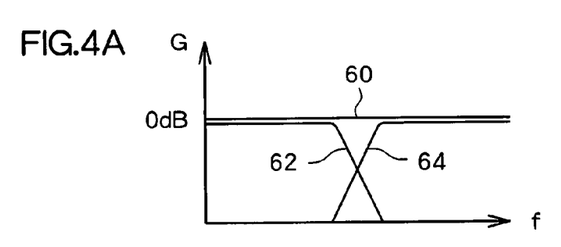
FIGS. 4A through 4E are graphs that describe the principle of tone control in the first embodiment of the present invention.

FIGS. 4A through 4E are graphs that describe the principle of tone control in the present circuit. FIGS. 4A through 4E show frequency spectrums, wherein the horizontal axis is the frequency f, and the vertical axis is the signal gain G that is based on $S_{IN}$. In FIG. 4A, spectrums 60, 62, and 64 represent the initial sound signal $S_{IN}$, low sound region component $S_{LO}$, and high sound region component $S_{HO}$, respectively.

Figure 4B:
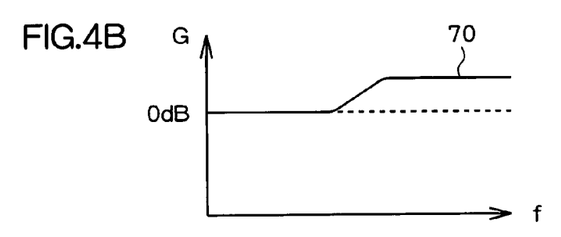

FIG. 4B shows a spectrum 70 in which the high sound region has been boosted. The high sound region adjustment circuit 36 outputs $S_{HB}$ as $S_{HT}$ during a high sound region boost operation, as described above. The signal $S_{HB}$ is superimposed on $S_{IN}$ in the synthesizing circuit 24, and $S_{OUT}$ is generated having the spectrum 70.

Figure 4C:
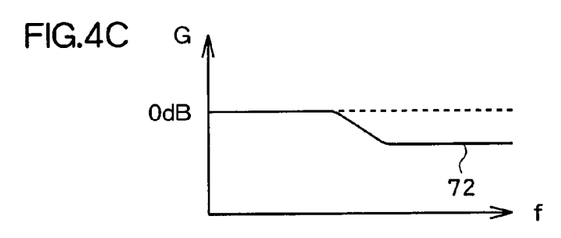

FIG. 4C shows a spectrum 72 in which the high sound region has been cut. The high sound region adjustment circuit 36 outputs $S_{HC}$ as $S_{HT}$ during cutting of a high sound region. The signal $S_{HC}$ has an inverse polarity from the high sound region component $S_{HO}$ of $S_{IN}$. For this reason, the high sound region component $S_{HO}$ of $S_{IN}$ is canceled out in accordance with the strength of $S_{HC}$ when $S_{HC}$ and $S_{IN}$ are synthesized in the synthesizing circuit 24, and $S_{OUT}$ is generated having the spectrum 72.

Figure 4D:
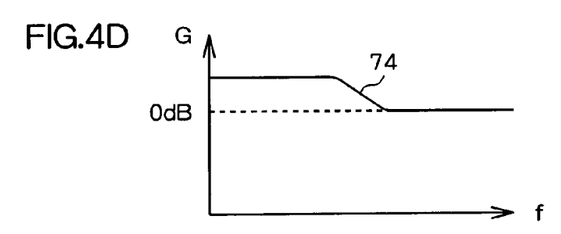

FIG. 4D shows a spectrum 74 in which the low sound region has been boosted. The low sound region adjustment circuit 38 outputs $S_{LB}$ as $S_{LT}$ during a low sound region boost operation. The signal $S_{LB}$ is superimposed on $S_{IN}$ in the synthesizing circuit 24, and $S_{OUT}$ is generated having the spectrum 74.

Figure 4E:
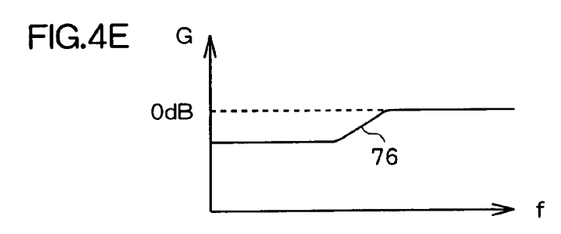

FIG. 4E shows a spectrum 76 in which the low sound region has been cut. The low sound region adjustment circuit 38 outputs $S_{LC}$ as $S_{LT}$ during cutting of a low sound region. The signal $S_{LC}$ has an inverse polarity from the low sound region component $S_{LO}$ of $S_{IN}$. Therefore, $S_{LC}$ and $S_{IN}$ are synthesized in the synthesizing circuit 24, whereby the low sound region component $S_{LO}$ of $S_{IN}$ is canceled out in accordance with strength of $S_{LC}$, and $S_{OUT}$ is generated having the spectrum 76.

Here, a specific case will be described in which the gain $G_{OUT}$ is configured so as to be adjustable within a range of ±12 dB. In this case, the following equation holds true when $G_{max}$ dB is the upper limit value or the lower limit value of the adjustment range of $G_{OUT}$, and $A_m$ is the amplitude ratio $S_{OUT}/S_{IN}$ of $S_{IN}$ and $S_{OUT}$ at this time.

$$G_{max} = 20 \log_{10} A_m \quad (1)$$

It is apparent from FIGS. 4B and 4D that the output signal $S_{HB}$ or $S_{LB}$ of the amplifier 52 is a factor of $(A_m-1)$ of $S_{IN}$ during maximum boosting. On the other hand, it is apparent from FIGS. 4C and 4E that the output signal $S_{HB}$ or $S_{LB}$ of the amplifier 52 is a factor of $(1-A_m)$ of $S_{IN}$ during maximum cutting. Since the attenuation factor of the attenuator 50 is set to 0 dB during such maximum boosting and maximum cutting, the amplitude ratio $|A_m-1|$ in relation to $S_{IN}$ of $S_{HB}$ and $S_{LB}$ corresponds to the gain $G_C$ of the amplifier 52. Specifically, $G_C$ is expressed by the following equation.

$$G_C = 20 \log_{10} |A_m - 1| \quad (2)$$

From Eqs. (1) and (2), the set value of $G_C$ in relation to $G_{OUT}=+12$ dB during maximum boosting is about 9.5 dB, and the set value of $G_C$ in relation to $G_{OUT}=-12$ dB during maximum cutting is about −2.5 dB. The switching of set values of $G_C$ that differ during boosting and cutting is carried out in synchronization with the mode signal $D_M$.

Figure 5:
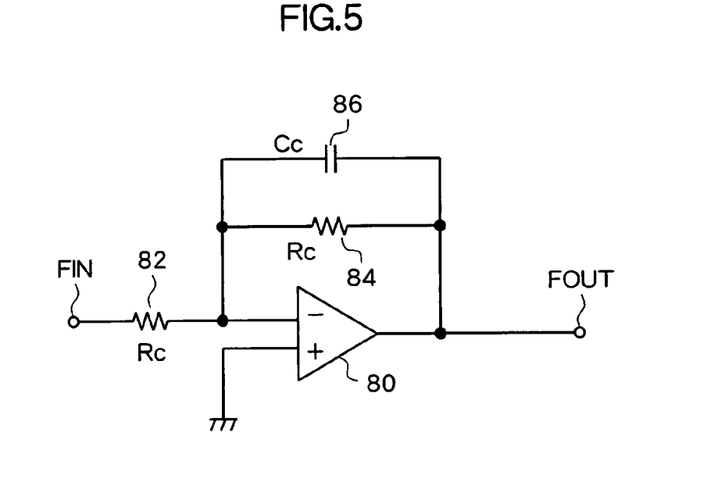
FIG. 5 is a circuit diagram showing the schematic configuration of an LPF used in the embodiments of the present invention.

The LPF 30 will be described next. FIG. 5 is a circuit diagram showing the schematic configuration of the LPF 30. The basic configuration of the LPF 30 used in the present apparatus is an RC active filter, and is composed of an operational amplifier 80, resistors 82 and 84, and a capacitor 86. These are integrally formed on a semiconductor substrate. The input signal $S_{IN}$ to the bass and treble audio tone control circuit is inputted to the input terminal FIN, and the output terminal of the operational amplifier 80 is the output terminal FOUT. The resistor 82 is connected in series between the input terminal FIN and the inverse input terminal of the operational amplifier 80. Also, the resistor 84 and capacitor 86 are connected in parallel between the reverse input terminal and the output terminal of the operational amplifier 80. The cutoff frequency $f_C$ of the LPF 30 is obtained using the following equation, wherein $R_C$ is the resistance value of the resistors 82 and 84, and $C_C$ is the capacitance value of the capacitor 86, for example.

$$f_C = 1/(2\pi R_C C_C) \quad (3)$$

The resistors 82 and 84 are composed of a resistance circuit that can achieve high resistance. An example of such a resistance circuit is one in which a MOSFET is used. The use of such a resistance circuit allows the area occupied by the resistors 82 and 84 on the substrate to be reduced while ensuring higher resistances thereof in comparison with a common resistance element that is formed using polysilicon or a diffusion layer on an IC.

Figure 6:
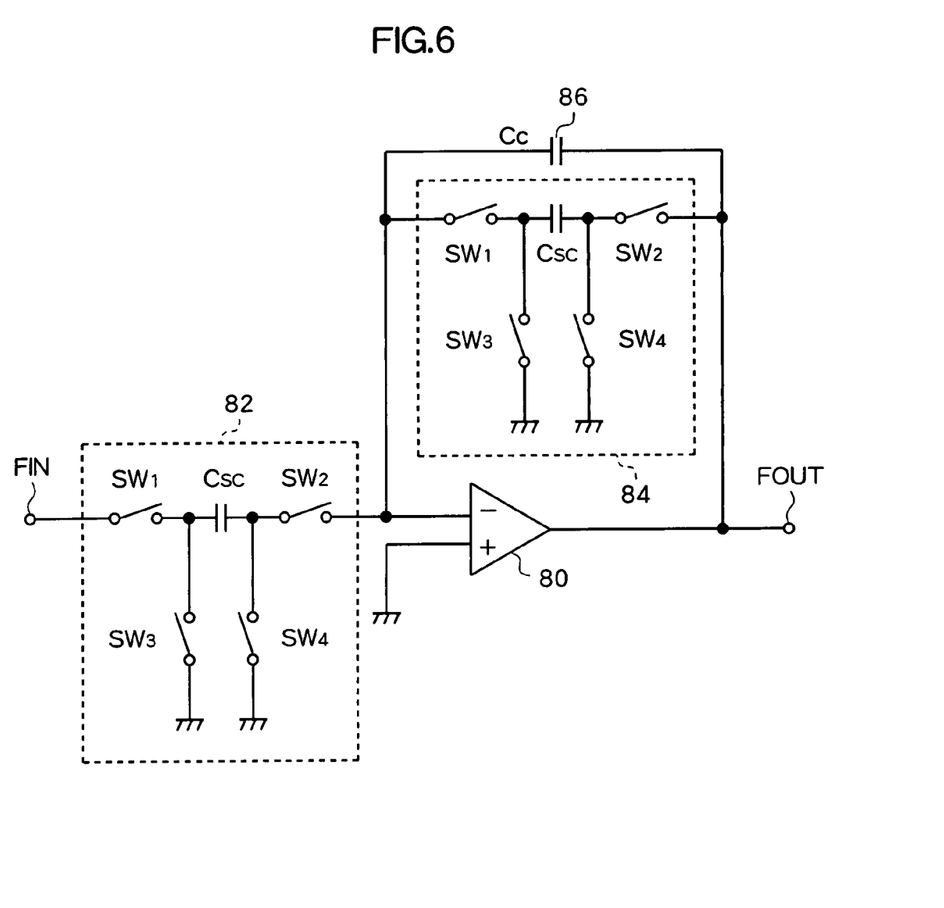
FIG. 6 is a schematic circuit diagram of an LPF in which the resistors shown in FIG. 5 are configured as a switched capacitor circuit.

In the present bass and treble audio tone control circuit, switched capacitor circuits are adopted as the resistance circuits that constitute the resistors 82 and 84, respectively, and the LPF 30 is configured as a switched capacitor filter. FIG. 6 is a schematic circuit diagram of the LPF 30 in which the resistors 82 and 24 are configured as a switched capacitor circuit.

The switched capacitor circuit is composed of a capacitor $C_{SC}$ and switch elements $SW_1$ to $SW_4$. The capacitor $C_{SC}$ is inserted in series between the input and output terminals of the switched capacitor circuit, and the switch elements $SW_1$ and $SW_2$ are disposed between the input and output terminals and the $C_{SC}$. The two ends of the capacitor $C_{SC}$ can be connected to ground, which acts as a reference voltage source, via the switch elements $SW_3$ and $SW_4$, respectively. The switch elements are configured using a transistor on a semiconductor substrate. The switched capacitor circuit periodically opens and closes the pair of switch elements $SW_1$ and $SW_2$ and the pair of switch elements $SW_3$ and $SW_4$ in an alternating fashion, whereby the capacitor $C_{SC}$ charges and discharges. A charge transfer is thereby produced and a pulsed electric current flows between the two terminals of the switched capacitor circuit. If the switching frequency $f_{SC}$ is sufficiently high, the average electric current between the two terminals of the switched capacitor circuit is equivalent to the current that passes through a resistor. In other words, the switched capacitor circuit functionally is equivalent to a resistor element. The resistance value $R_{SC}$ is expressed by the following equation.

$$R_{SC} = 1/(C_{SC} f_{SC}) \quad (4)$$

The resistance $R_{SC}$ can be increased in inverse proportion to the reduction of the $f_{SC}$, as shown in Eq. (4). In other words, the use of a switched capacitor circuit increases the $R_C$ in accordance with the $f_{SC}$ and reduces the $C_C$, and the capacitor 86 can be reduced to a size that easily allows formation on a semiconductor substrate.

For example, the $R_{SC}$ is 4 MΩ in a switched capacitor circuit in which $f_{SC}$=250 kHz and $C_{SC}$=1 pF. When the cutoff frequency $f_C$ of the LPF 30 is set to 1 kHz, the $C_C$ is 40 pF when the $R_C$ is configured using a switched capacitor circuit. In other words, the capacitance required in the LPF 30 is about 40 pF when combined with the $C_{SC}$ that constitutes the switched capacitor circuit, and the LPF 30 can be integrally formed with these capacitances on a single IC.

As described above, the LPF 30 has a $R_C$ that is set to a high-resistance value, whereby the capacitor 86 can be accommodated in an IC and the number of external pins and components can be reduced. The resistors 82 and 84 having a high-resistance value $R_C$ can be configured so that the surface area occupied on an IC is reduced through the use of a switched capacitor circuit. Here, the resistance circuit is composed of a plurality of elements, and a certain size or larger is required. For this reason, the advantage of reducing the surface area on the semiconductor substrate is difficult to achieve even if the resistance elements are substituted with resistance circuits in a filter circuit that includes a large number of resistance elements having a relatively low resistance value in a manner similar to the circuit shown in FIG. 1. However, the LPF 30 is composed of only a small number of resistance elements that have large resistance values, as described above. Therefore, the effect of reducing the surface can be considerable when resistance elements are substituted with resistance circuits. Also, from this viewpoint, the configuration of the LPF 30 is not limited to the configuration shown in FIG. 5, and other circuit configurations that allow the capacitors to be made smaller can be adopted by increasing the resistance of a small number of resistance elements.

The bass and treble audio tone control circuit of the present embodiment is configured to generate a high sound region by using the difference between the initial sound signal and the low sound region that has been extracted using the LPF 30. Conversely, it is also possible to have a configuration in which a low sound region is generated by the difference between the initial sound signal and the high sound region that has been extracted using an HPF.

Embodiment 2

Figure 7:
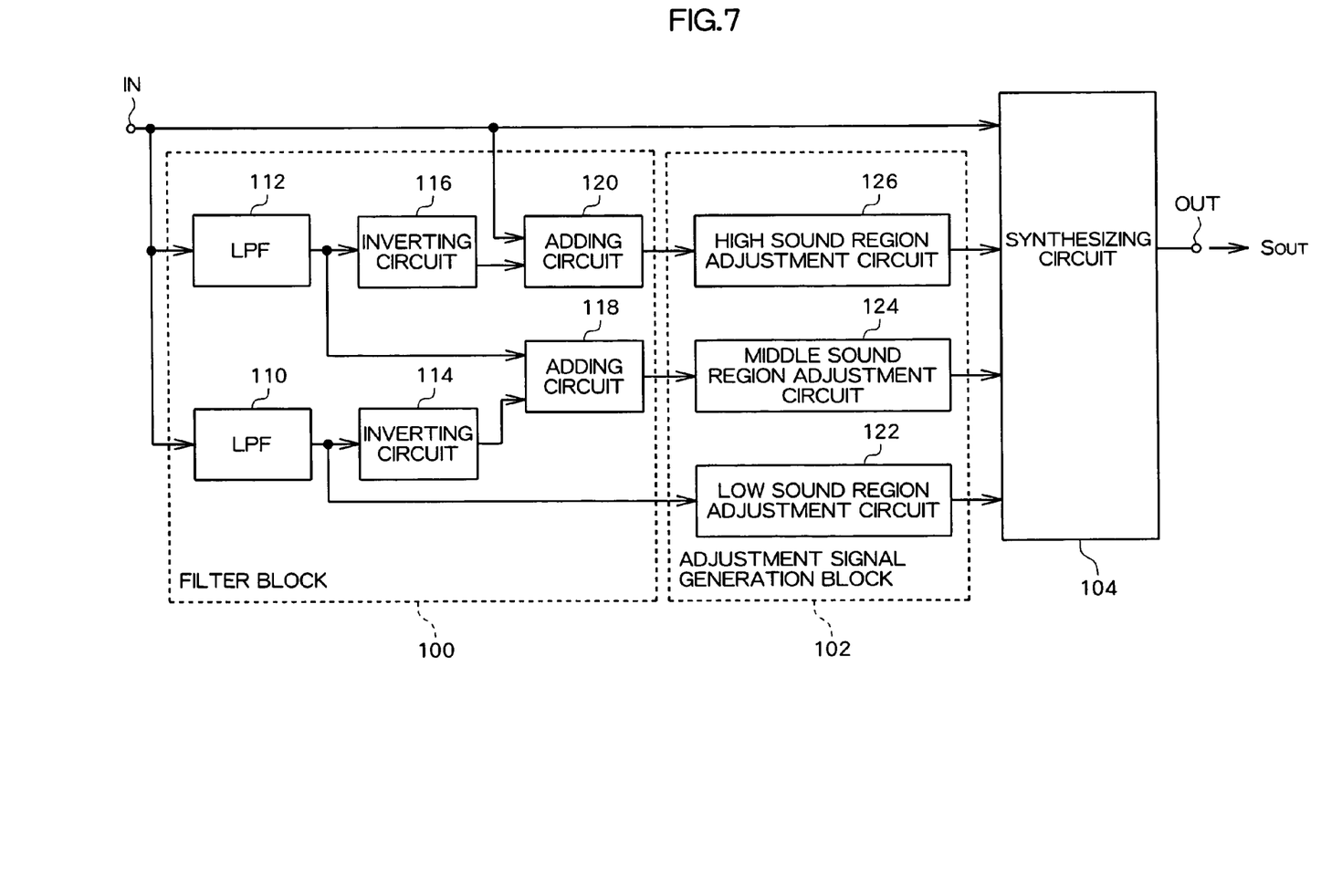
FIG. 7 is a schematic block diagram of a graphic equalizer as the second embodiment of the present invention.

FIG. 7 is a schematic block diagram of a graphic equalizer as the second embodiment of the present invention. The bass and treble audio tone control circuit of the first embodiment described above is one in which the gain of two bands, i.e., the high sound region and the low sound region, is adjusted. In contrast, the graphic equalizer of the present embodiment is different from the bass and treble audio tone control circuit of the first embodiment in that the gain of three bands, i.e., the high sound region, the middle band region, and the low sound region, is adjusted, but the configurations also have features that are essentially the same.

The present circuit is integrally formed on a semiconductor substrate as an IC. The present circuit receives the initial sound signal $S_{IN}$ as input to the input terminal IN; can perform boosting and cutting in each band, i.e., the high sound region, the middle sound region, and the low sound region; and outputs to the output terminal OUT the output sound signal $S_{OUT}$ thus adjusted for gain in each band. In the present circuit, the switch between boosting and cutting in each band and the gain setting for boosting and cutting are carried out based on instruction signals from an external circuit.

The present circuit is composed of a filter block 100, an adjustment signal generation block 102, and a synthesizing circuit 104. The filter block 100 is composed of LPFs 110 and 112, inverting circuits 114 and 116, and adding circuits 118 and 120. The adjustment signal generation block 102 is composed of a low sound region adjustment circuit 122, a middle sound region adjustment circuit 124, and a high sound region adjustment circuit 126.

The LPFs 110 and 112 can be configured in the same manner as the first embodiment, and can particularly be configured having the capacitors accommodated on a semiconductor substrate by using switched capacitors. In this case, the cutoff frequency $f_{C1}$ of the LPF 110 is set to be lower than the cutoff frequency $f_{C2}$ of the LPF 112.

The inverting circuits 114 and 116 are the same circuits as the inverting circuit 32 in the bass and treble audio tone control circuit of the first embodiment, and the adding circuits 118 and 120 are the same circuits as the adding circuit 34. The low sound region adjustment circuit 122, middle sound region adjustment circuit 124, and high sound region adjustment circuit 126 can be configured in the manner shown in FIG. 3, for example.

The filter block 100 has an extraction circuit for each band and extracts the high sound region component $S_{HO}$, middle sound region component $S_{MO}$, and low sound region component $S_{LO}$ from the $S_{IN}$. In other words, the LPF 110 constitutes a low sound region extraction circuit. Also, the LPFs 110 and 112, the inverting circuit 114, and the adding circuit 118 constitute a middle sound region extraction circuit. The LPF 112, the inverting circuit 116, and the adding circuit 120 constitute a high sound region extraction circuit.

Figure 8A:
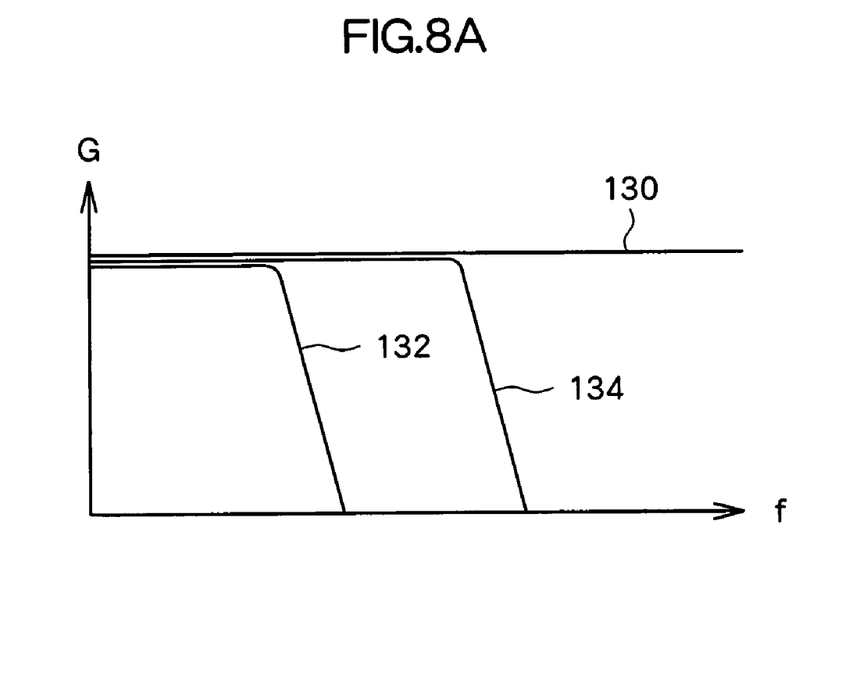
FIGS. 8A and 8B are graphs that describe the principle of extraction processing of the band components in the second embodiment of the present invention.
Figure 8B:
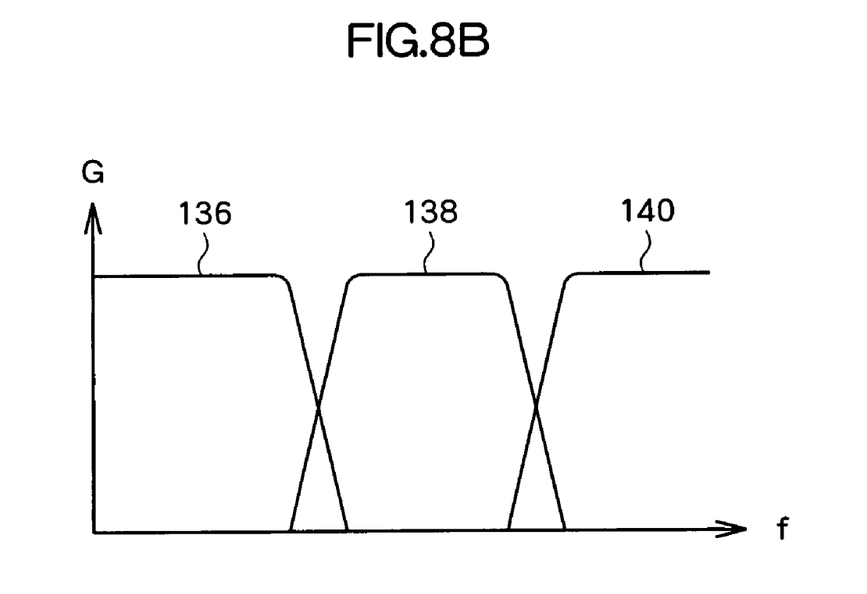

FIGS. 8A and 8B are graphs that describe the principle of extracting the band components in the present circuit. FIGS. 8A and 8B show frequency spectrums, wherein the horizontal axis is the frequency f, and the vertical axis is the signal gain G that is based on $S_{IN}$. In FIG. 8A, spectrums 130, 132, and 134 represent the initial sound signal $S_{IN}$, the output signal $S_{LPF1}$ of LPF 110, and the output signal $S_{LPF2}$ of LPF 112, respectively. The spectrums 136, 138, and 140 that are shown in FIG. 8B represent the low sound region component $S_{LO}$, the middle sound region component $S_{MO}$, and the high sound region component $S_{HO}$, respectively, which are included in the initial sound signal $S_{IN}$.

The output signal $S_{LPF1}$ of the LPF 110 is outputted from the filter block 100 as the low sound region component $S_{LO}$ and is inputted to the low sound region adjustment circuit 122. Specifically, the spectrum 130 and the spectrum 136 are the same. Also, $S_{LO}$ is inverted by the inverting circuit 114 and is then inputted to the adding circuit 118. The adding circuit 118 receives $S_{LPF2}$ as input from the LPF 112, calculates the difference between the $S_{LPF2}$ and the $S_{LPF1}$, as shown in the following equation, and extracts the middle sound region component $S_{MO}$ indicated by the spectrum 138. The $S_{MO}$ thus extracted is inputted from the filter block 100 to the middle sound region adjustment circuit 124.

$$S_{MO} = S_{LPF2} - S_{LPF1} \qquad (5)$$

The output signal $S_{LPF2}$ of the LPF 112 is inputted to the adding circuit 118 described above, and is also inputted to the inverting circuit 116. The inverting circuit 116 inverts $S_{LPF2}$ and inputs the result to the adding circuit 120. The adding circuit 120 furthermore receives the initial sound signal $S_{IN}$, calculates the difference between the $S_{IN}$ and $S_{LPF2}$ as shown in the following equation, and extracts the high sound region component $S_{HO}$ indicated by the spectrum 140. The $S_{HO}$ thus extracted is inputted from the filter block 100 to a high sound region adjustment circuit 126.

$$S_{HO}=S_{IN}-S_{LPF2} \quad (6)$$

In the adjustment signal generation block 102, the low sound region adjustment circuit 122, middle sound region adjustment circuit 124, and high sound region adjustment circuit 126 adjust the gain of the low sound region component $S_{LO}$, middle sound region component $S_{MO}$, and high sound region component $S_{HO}$ thus inputted, respectively, and generate a low sound region adjustment signal $S_{LT}$, a middle sound region adjustment signal $S_{MT}$, and a high sound region adjustment signal $S_{HT}$.

The low sound region adjustment signal $S_{LT}$, middle sound region adjustment signal $S_{MT}$, and high sound region adjustment signal $S_{HT}$ outputted from the adjustment signal generation block 102 are inputted to the synthesizing circuit 104. The synthesizing circuit 104 also receives the initial sound signal $S_{IN}$ as input, and the signals $S_{IN}$, $S_{LT}$, $S_{MT}$, and $S_{HT}$ are added, synthesized, and outputted as $S_{OUT}$.

As described above, the adjustment signals $S_{LT}$, $S_{MT}$, and $S_{HT}$ are generated as positive polarity signals during boosting, and as negative polarity signals during cutting in accordance with the mode signal $D_M$ in the circuit shown in FIG. 3, in the same manner as the first embodiment. The synthesizing circuit 104 synthesizes the adjustment signals with the initial sound signal $S_{IN}$ to generate an $S_{OUT}$ by performing boosting in a frequency band in which the positive polarity adjustment signals are superimposed, and performing cutting in a frequency band that has been canceled out by the negative polarity adjustment signals.

In the present embodiment, a graphic equalizer is described as an example for the simplest case in which the initial sound signal is divided into three frequency bands and is adjusted, but the present invention may be applied to a graphic equalizer that divides an initial sound signal into n number of frequency bands (n≧3) and makes adjustments. In such a case, (n−1) LPFs are used. The following equation holds true when the cutoff frequency of the $k^{th}$ LPF (1≦k≦n−1) is expressed as $f_{Ck}$, and $f_{Ck}$ is set in correspondence with the border between the $k^{th}$ frequency band and the $(k+1)^{th}$ frequency band.

$$f_{C1}<f_{C2}<\ldots<f_{C(n-2)}<f_{C(n-1)} \quad (7)$$

The first extraction circuit extracts the lowest first frequency component from the initial sound signal via the first LPF. In the embodiment described above, the LPF 110 corresponds to the first LPF.

The $k^{th}$ extraction circuit (2≦k≦n−1) generates a difference between the output signal of the $k^{th}$ LPF and the output signal of the $(k-1)^{th}$ LPF for the initial sound signal, and outputs the result as the $k^{th}$ frequency band component. In the embodiment described above, the processing shown by the Eq. (5) when $S_{MO}$ is generated corresponds to the processing that is used for generating this difference.

The $n^{th}$ extraction circuit generates a difference between the initial sound signal and the output signal of the $(n-1)^{th}$ LPF, and outputs the result the $n^{th}$ frequency band component. In the embodiment described above, the processing shown by the Eq. (6) when $S_{HO}$ is generated corresponds to the processing that is used for generating this difference.

The graphic equalizer of the present embodiment is configured to extract the component of each frequency band using the LPFs 110 and 112. Conversely, it is also possible to have a configuration in which the component of each frequency band is extracted using an HPF.

The embodiment described above describes a sound signal equalizer for adjusting the characteristics of a sound signal as the initial signal. However, the present invention can also be applied to a signal equalizer to which an initial signal other than a sound signal is inputted and which adjusts the gain of each frequency band. An example of such a signal equalizer is one in which a video signal is the initial signal. For example, the present invention can be applied to a signal equalizer that boosts or cuts the high region component or the low region component of a brightness signal that is part of a video signal.

The sound signal equalizer and the signal equalizer of the present invention have a configuration with a separately configured extraction circuit for extracting the component of each frequency band, and gain adjustment circuit for adjusting the gain of an extracted component, whereby the extraction circuit has capacitors that correspond to a circuit provided with conventional external components, and does not require a series resistor in which the division ratio is changed by switches. The resistance used in the extraction circuit is thereby given a simpler structure, a circuit that is equivalent to a resistance element is used to thereby facilitate a smaller size and higher resistance, the capacitance can be lowered and the capacitors can be made smaller accordingly, and the circuit can be reduced in size. As a further result, the capacitors can be internally accommodated and the number of pins and external components can be reduced in a sound signal equalizer configured as an integrated circuit.

What is claimed is:

1. A sound signal equalizer for adjusting gain in each of first to $n^{th}$ (where n is an integer of 2 or higher) frequency bands of an initial sound signal, the circuit comprising:

first to $n^{th}$ extraction circuits that are provided in corresponding fashion to the first to $n^{th}$ frequency bands and that extract and output a corresponding frequency band component of the initial sound signal, first to $n^{th}$ gain adjustment circuits that are provided in corresponding fashion to the first to $n^{th}$ extraction circuits and that adjust the gain of an output signal of the corresponding extraction circuit and generate first to $n^{th}$ sound region adjustment signals a synthesizing circuit that can synthesize the first to $n^{th}$ sound region adjustment signals in the initial sound signal, a first filter as a one-sided band pass filter provided with prescribed characteristics selected from high-pass characteristics and low-pass characteristics, the sound signal equalizer including first to $(n-1)^{th}$ filters; and a $k^{th}$ filter that has a wider pass band than a $(k-1)^{th}$ (wherein k is an arbitrary integer that satisfies the expression 2≦k≦n−1) filter, and that is the one-sided band pass filter, wherein the first extraction circuit extracts the first frequency band component from the initial sound signal with the aid of the first filter;

the $k^{th}$ extraction circuit generates a difference between the output signal of the $k^{th}$ filter and the output signal of the $(k-1)^{th}$ filter for the initial sound signal, and outputs the difference as the $k^{th}$ frequency band component in the initial sound signal, and the $n^{th}$ extraction circuit generates a difference between the initial sound signal and the output signal of the $(n-1)^{th}$ filter, and outputs the difference as the $n^{th}$ frequency band component in the initial sound signal.

2. The sound signal equalizer of claim 1, wherein the first filter and the $k^{th}$ filter are configured using switched capacitor filters.

3. The sound signal equalizer of claim 2, wherein the first to $(n-1)^{th}$ filters are provided with a resistor R and a capacitor C for adjusting the filter characteristics, and are RC active filters in which the resistor R and capacitor C synergistically contribute to a cutoff frequency; and the resistor R is configured as equivalent resistance produced by a switched capacitor.

4. The sound signal equalizer of claim 3, wherein the first to $(n-1)^{th}$ filters are formed as an integrated circuit on a semiconductor substrate.

5. The sound signal equalizer of claim 1, wherein a tone control process for adjusting the strength of a high sound region and a low sound region of the initial sound signal is carried out in a case in which the term n is 2.

6. A signal equalizer for adjusting gain in each of first to $n^{th}$ (where n is an integer of 2 or higher) frequency bands for an initial signal, the circuit comprising:

first to $n^{th}$ extraction circuits that are provided in corresponding fashion to the first to $n^{th}$ frequency bands and that extract and output a corresponding frequency band component of the initial signal, first to $n^{th}$ gain adjustment circuits that are provided in corresponding fashion to the first to $n^{th}$ extraction circuits and that adjust the gain of an output signal of the corresponding extraction circuit and generate first to $n^{th}$ adjustment signals, a synthesizing circuit that can synthesize the first to $n^{th}$ adjustment signals in the initial signal, a first filter as a one-sided band pass filter provided with prescribed characteristics selected from high-pass characteristics and low-pass characteristics, the sound signal equalizer including first to $(n-1)^{th}$ filters; and a $k^{th}$ filter that has a wider pass band than a $(k-1)^{th}$ (wherein k is an arbitrary integer that satisfies the expression $2 \leq k \leq n-1$) filter, and that is the one-sided band pass filter, wherein the first extraction circuit extracts the first frequency band component from the initial sound signal with the aid of the first filter;

the $k^{th}$ extraction circuit generates a difference between the output signal of the $k^{th}$ filter and the output signal of the $(k-1)^{th}$ filter for the initial sound signal, and outputs the difference as the $k^{th}$ frequency band component in the initial sound signal, and the $n^{th}$ extraction circuit generates a difference between the initial sound signal and the output signal of the $(n-1)^{th}$ filter, and outputs the difference as the $n^{th}$ frequency band component in the initial sound signal.

7. The sound signal equalizer of claim 1, wherein the first filter and the $k^{th}$ filter are low-pass filters, the $k^{th}$ extraction circuit includes a first inverting circuit for inverting the output signal of the $(k-1)^{th}$ filter and a first adding circuit configured to have as inputs the output signal of the $k^{th}$ filter and the output of the first inverting circuit and output the $k^{th}$ frequency band component in the initial sound signal, and the $n^{th}$ extraction circuit includes a second inverting circuit for inverting the output signal of the $(n-1)^{th}$ filter, and a second adding circuit configured to have as inputs the initial sound signal and the output of the second inverting circuit and output the $n^{th}$ frequency band component in the initial sound signal.

8. The sound signal equalizer of claim 6, wherein the first filter and the $k^{th}$ filter are low-pass filters, the $k^{th}$ extraction circuit includes a first inverting circuit for inverting the output signal of the $(k-1)^{th}$ filter and a first adding circuit configured to have as inputs the output signal of the $k^{th}$ filter and the output of the first inverting circuit and output the $k^{th}$ frequency band component in the initial sound signal, and the $n^{th}$ extraction circuit includes a second inverting circuit for inverting the output signal of the $(n-1)^{th}$ filter, and a second adding circuit configured to have as inputs the initial sound signal and the output of the second inverting circuit and output the $n^{th}$ frequency band component in the initial sound signal.

9. The sound signal equalizer of claim 1, wherein the first filter and the $k^{th}$ filter are high-pass filters, the $k^{th}$ extraction circuit includes a first inverting circuit for inverting the output signal of the $(k-1)^{th}$ filter and a first adding circuit configured to have as inputs the output signal of the $k^{th}$ filter and the output of the first inverting circuit and output the $k^{th}$ frequency band component in the initial sound signal, and the $n^{th}$ extraction circuit includes a second inverting circuit for inverting the output signal of the $(n-1)^{th}$ filter, and a second adding circuit configured to have as inputs the initial sound signal and the output of the second inverting circuit and output the $n^{th}$ frequency band component in the initial sound signal.

10. The sound signal equalizer of claim 6, wherein the first filter and the $k^{th}$ filter are high-pass filters, the $k^{th}$ extraction circuit includes a first inverting circuit for inverting the output signal of the $(k-1)^{th}$ filter and a first adding circuit configured to have as inputs the output signal of the $k^{th}$ filter and the output of the first inverting circuit and output the $k^{th}$ frequency band component in the initial sound signal, and the $n^{th}$ extraction circuit includes a second inverting circuit for inverting the output signal of the $(n-1)^{th}$ filter, and a second adding circuit configured to have as inputs the initial sound signal and the output of the second inverting circuit and output the $n^{th}$ frequency band component in the initial sound signal.

11. The sound signal equalizer of claim 1, wherein the synthesizing circuit has as inputs the initial sound signal, the output from a high sound region adjustment circuit, and the output from a low sound region adjustment circuit.

12. The sound signal equalizer of claim 6, wherein the synthesizing circuit has as inputs the initial sound signal, the output from a high sound region adjustment circuit, and the output from a low sound region adjustment circuit.

* * * * *